(12) United States Patent
Narumi et al.

(10) Patent No.: US 9,502,340 B2
(45) Date of Patent: Nov. 22, 2016

(54) METHOD FOR MANUFACTURING WIRING BOARD

(71) Applicant: KYOCERA SLC Technologies Corporation, Yasu-shi, Shiga (JP)

(72) Inventors: Daisuke Narumi, Otsu (JP); Yoshinori Nakatomi, Nagahama (JP); Masaharu Yasuda, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 415 days.

(21) Appl. No.: 14/101,989

(22) Filed: Dec. 10, 2013

(65) Prior Publication Data

US 2014/0182126 A1    Jul. 3, 2014

(30) Foreign Application Priority Data

Dec. 28, 2012 (JP) .................................. 2012-286492

(51) Int. Cl.
```
H01L 23/498    (2006.01)
H05K 3/00      (2006.01)
H05K 3/46      (2006.01)
```
(52) U.S. Cl.
CPC ....... *H01L 23/49822* (2013.01); *H05K 3/0097* (2013.01); *H05K 3/4682* (2013.01); *H01L 2224/16225* (2013.01); *Y10T 29/49156* (2015.01)

(58) Field of Classification Search
CPC ...................... H01L 23/49822; H05K 3/0097; H05K 3/4682
See application file for complete search history.

(56) References Cited

U.S. PATENT DOCUMENTS

| | | | | |
|---|---|---|---|---|
| 7,441,330 B2* | 10/2008 | Takano | ................ | H05K 3/0097 29/825 |
| 7,594,317 B2* | 9/2009 | Nakamura | ............. | H05K 3/205 29/825 |
| 8,264,849 B2* | 9/2012 | Guzek | ..................... | H01L 24/24 257/686 |
| 2007/0289128 A1* | 12/2007 | Takano | ................ | H05K 3/0097 29/830 |

(Continued)

FOREIGN PATENT DOCUMENTS

| JP | 2004-235323 | * | 8/2004 | ............... H05K 3/46 |
|---|---|---|---|---|
| JP | 4273895 B2 | | 6/2009 | |

(Continued)

OTHER PUBLICATIONS

Office Action dated Mar. 25, 2016, issued in counterpart Japanese application No. 2012-286492.

*Primary Examiner* — Peter DungBa Vo
*Assistant Examiner* — Jeffrey T Carley
(74) *Attorney, Agent, or Firm* — Procopio Cory Hargreaves and Savitch LLP

(57) ABSTRACT

A method for manufacturing a wiring board according to the present invention includes the steps of preparing a supporting substrate having a product forming region and a marginal region; preparing a separable metal foil whose area is larger than that of the product forming region and is smaller than that of the supporting substrate; fixing the separable metal foil to the supporting substrate by burying into the supporting substrate; forming a build-up section on the buried separable metal foil; integrally cutting out the supporting substrate, the separable metal foil and the build-up section; obtaining a laminated body for wiring board composed of the second metal foil and the build-up section by separating the first metal foil and the second metal foil; and forming the wiring conductor layer by removing a part of the second metal foil.

4 Claims, 8 Drawing Sheets

(56) References Cited

U.S. PATENT DOCUMENTS

| | | | | |
|---|---|---|---|---|
| 2008/0128157 A1* | 6/2008 | Murata | H01L 21/4807 | 174/250 |
| 2009/0242261 A1* | 10/2009 | Takenaka | H05K 1/0271 | 174/262 |
| 2009/0260866 A1* | 10/2009 | Palm | H01L 21/561 | 174/260 |
| 2010/0319966 A1* | 12/2010 | Liu | H05K 13/00 | 174/255 |
| 2011/0079349 A1* | 4/2011 | Cho | H05K 3/4682 | 156/247 |
| 2011/0147923 A1* | 6/2011 | Sir | H01L 21/4857 | 257/737 |
| 2011/0154658 A1* | 6/2011 | Chuang | H05K 3/0097 | 29/829 |
| 2011/0317383 A1* | 12/2011 | Guzek | H01L 24/24 | 361/764 |
| 2012/0102732 A1 | 5/2012 | Maeda | | |
| 2012/0279630 A1* | 11/2012 | Chuang | H05K 3/0097 | 156/48 |

FOREIGN PATENT DOCUMENTS

| | | |
|---|---|---|
| JP | 2011-119501 A | 6/2011 |
| JP | 2011-199077 A | 6/2011 |
| JP | 2012-94682 A | 5/2012 |

* cited by examiner

METHOD FOR MANUFACTURING WIRING BOARD

BACKGROUND OF THE INVENTION

1. Field of the Invention

The present invention relates to a method for manufacturing a wiring board used for mounting a semiconductor element such as a microchip.

2. Description of Related Art

In recent years, amid the advance in a high performance and thinning of electronic devices such as portable video game players and communication devices, build-up wiring boards are present as high-density wiring boards used for these devices. General build-up wiring boards have a configuration such that insulating layers and wiring conductors are alternately laminated on both surfaces of a core substrate having a thickness of about 0.2 to 2.0 mm. Core substrates are formed by a resin substrate and a wiring conductor. The resin substrate is obtained by impregnating an electric insulating material such as epoxy resin in a glass fiber. The wiring conductor is made of a copper foil. The insulating layer is formed of resin having a thickness of about 10 to 100 µm, and the wiring conductor is formed by a plated metal layer having a thickness of about 5 to 50 µm.

Although high-density wiring is enabled in such a general build-up wiring board, a core substrate having a thickness of about 0.2 to 2.0 mm is used. For this reason, it is difficult to thin the entire thickness of wiring boards.

For example, Japanese Patent No. 4273895 describes a method for manufacturing a thin and high-density circuit board without a core substrate. In this method, ultrathin copper foils with a carrier copper foil are laminated on supporting substrates of the uniform size. The carrier copper foil holds the ultrathin copper foil via a release layer. A plurality of insulating layers and a plurality of wiring conductors made of a plated metal layer are alternately laminated on the ultrathin copper foil. Thereafter, the circuit board that is being manufactured is separated into the ultrathin copper foil and the carrier copper foil so that the ultrathin copper foil is removed.

However, in the method described in Japanese Patent No. 4273895, since the ultrathin copper foil with the carrier copper foil and the supporting substrate have the same size, a boundary between the carrier copper foil and the ultrathin copper foil is exposed outside. For this reason, for example, a plating solution for forming a wiring conductor occasionally infiltrates both the carrier copper foil and the ultrathin copper foil through the boundary therebetween. When the plating medical solution infiltrates in such a manner, adhesion between the carrier copper foil and the ultrathin copper foil is weakened, and thus a circuit board that is being manufactured is occasionally peeled from a supporting substrate. For this reason, fabrication yield of the wiring board comes down, and circuit boards cannot be efficiently manufactured.

SUMMARY OF THE INVENTION

In the present invention, a medical solution is prevented from infiltrating via a boundary between copper foils for separating a supporting substrate and a build-up section so that the build-up section is prevented from being peeled from the supporting substrate. As a result, it is an object of the present invention to provide a method for manufacturing a wiring board in which the fabrication yield of the wiring board is improved, and producibility is high.

A method for manufacturing a wiring board of the present invention includes the steps of: preparing a supporting substrate having a product forming region and a frame-shaped marginal region surrounding the product forming region; preparing a separable metal foil which is composed of a first metal foil and a second metal foil that are separably adhered to each other and whose area is larger than that of the product forming region and is smaller than that of the supporting substrate; fixing a lower surface and a side surface of the separable metal foil to the supporting substrate by pressing the separable metal foil against an upper surface of the product forming region with the first metal foil facing the supporting substrate, and burying the lower surface and the side surface of the separable metal foil into the supporting substrate; forming a build-up section composed of a plurality of insulating layers and a plurality of wiring conductor layers by laminating and fixing the insulating layers and the wiring conductor layers alternately on the buried separable metal foil; integrally cutting out the supporting substrate, the separable metal foil and the build-up section that form the product forming region by cutting the supporting substrate, the separable metal foil and the build-up section on a boundary between the product forming region and the marginal region; obtaining a laminated body for wiring board composed of the second metal foil and the build-up section by separating the cut-out supporting substrate and the build-up section between the first metal foil and the second metal foil; and forming the wiring conductor layer on a lower surface of the build-up section by removing a part of the second metal foil fixed to the build-up section through etching.

In the method for manufacturing the wiring board of the present invention, the separable metal foil which is composed of the first metal foil and the second metal foil that are separably adhered to each other and whose area is larger than the area of the product forming region and is smaller than the area of the supporting substrate is pressurized against the upper surface of the product forming region so that the first metal foil faces the supporting substrate and is buried into the supporting substrate, and the lower surface and the side surface of the separable metal foil are fixed to the supporting substrate. For this reason, the boundary between the first and second metal foils can be shielded from external environments, and a medical solution for forming the wiring conductor layer can be prevented from infiltrating the boundary. As a result, the method for manufacturing the wiring board having a high producibility, in which adhesion between the build-up section and the supporting substrate is not poor and the build-up section is not peeled, can be provided.

DESCRIPTION OF PREFERRED EMBODIMENTS

A method for manufacturing a wiring board according to one embodiment of the present invention is described with reference to FIGS. 1A to 1J. As illustrated in FIG. 1A, two prepregs 8P, two separation films 9, and two separable metal foils 10 are prepared.

Figure 1:
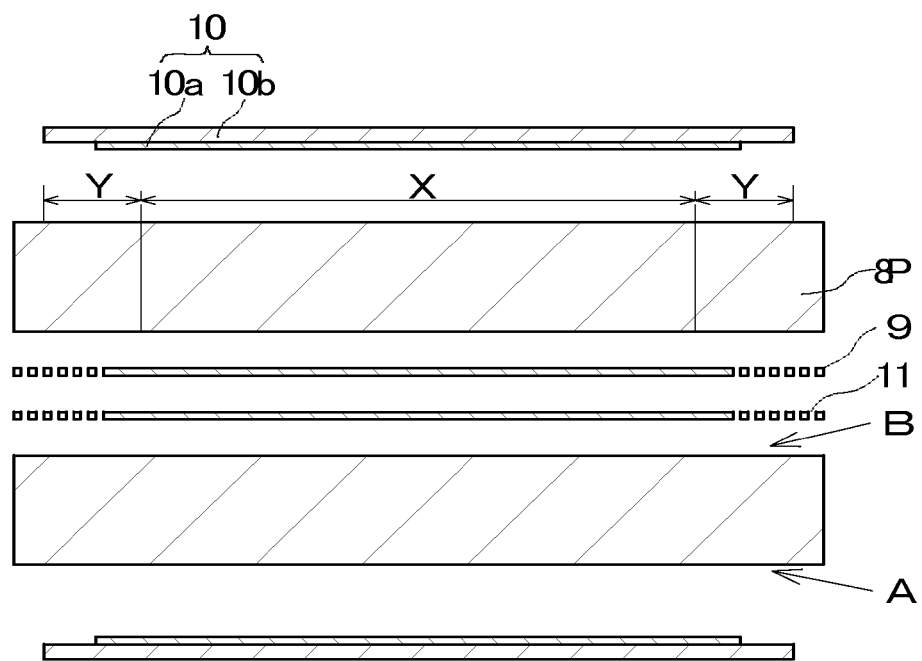
FIGS. 1A to 1J are schematic cross-sectional views illustrating a method for manufacturing a wiring board according to one embodiment of the present invention.
Figure 1:
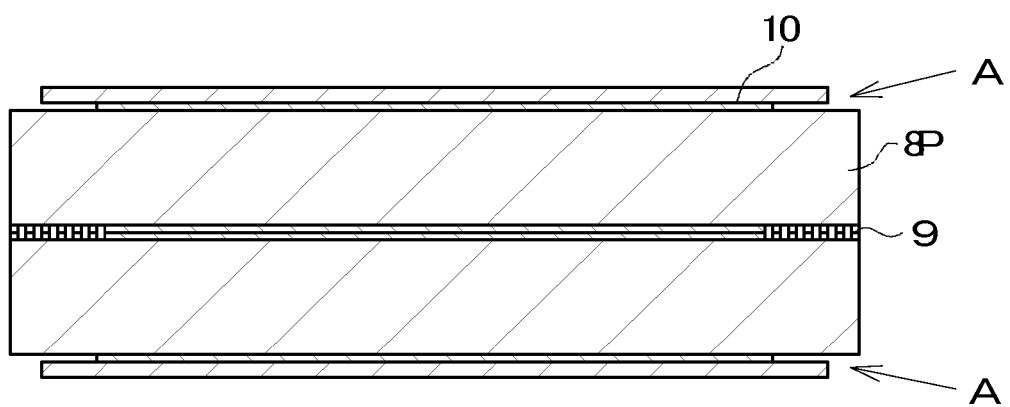
Figure 1:
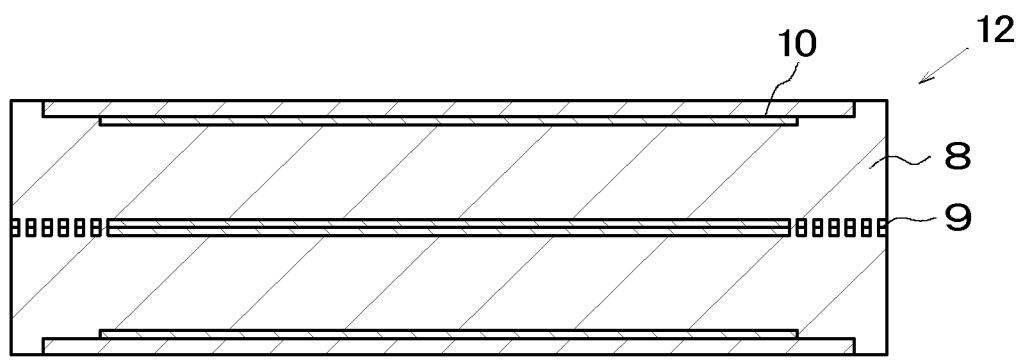
Figure 1:
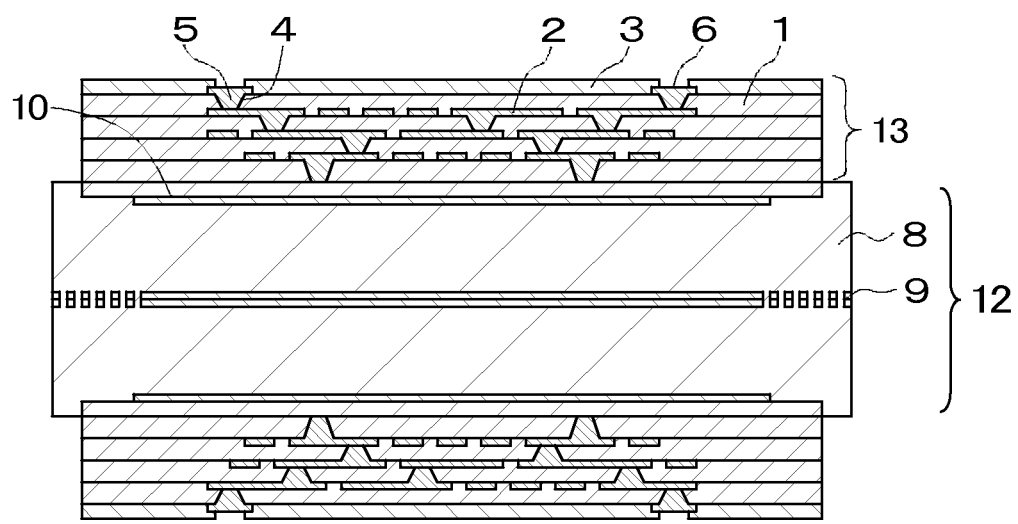
Figure 1:
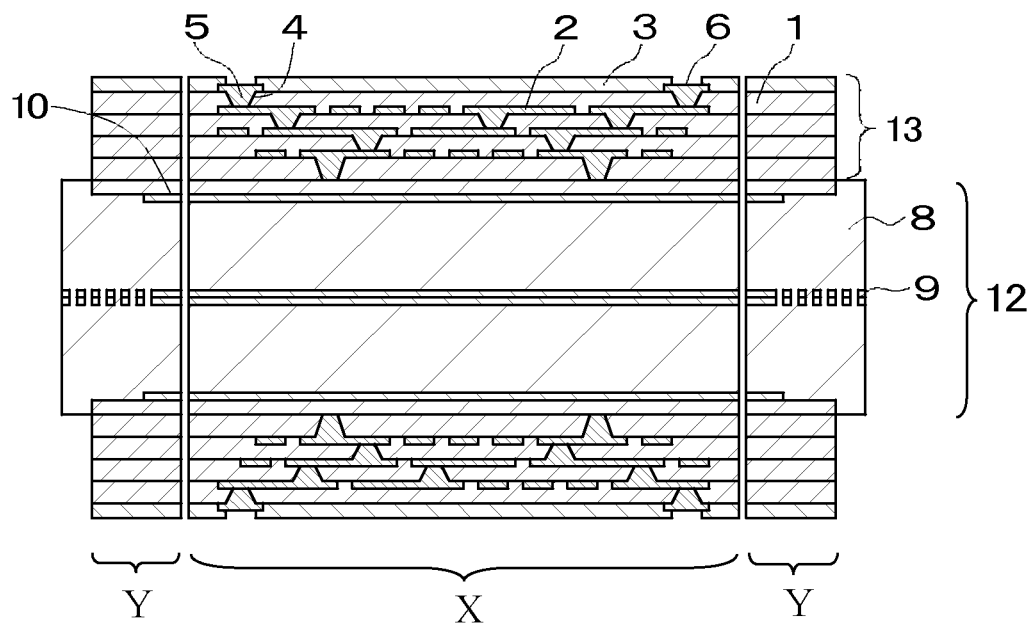
Figure 1:
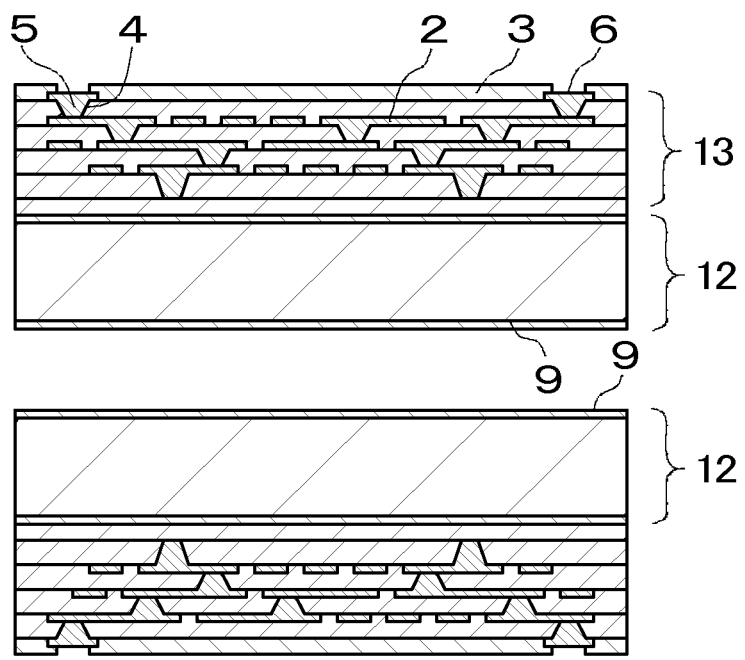
Figure 1:
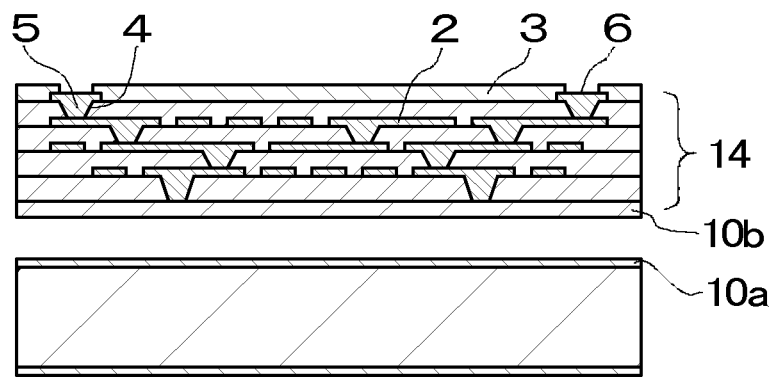
Figure 1:
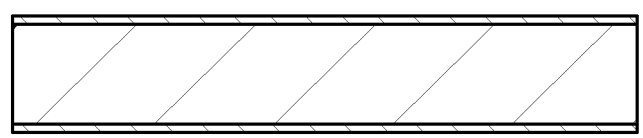
Figure 1:
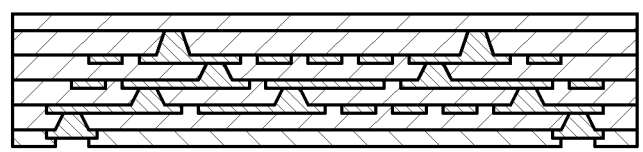
Figure 1:
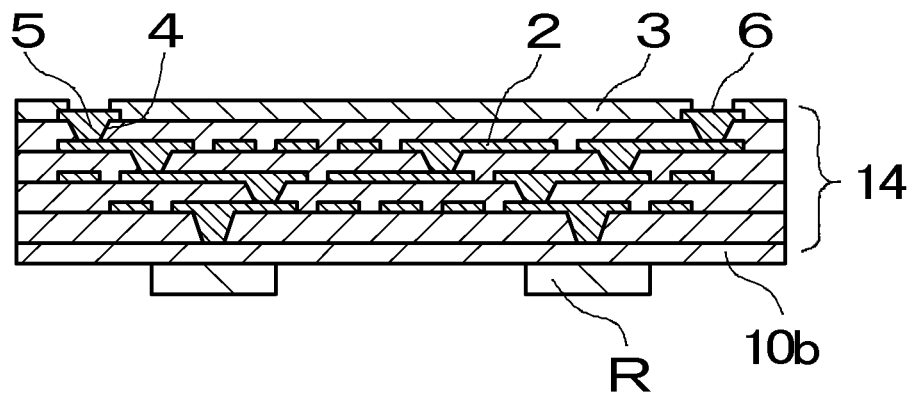
Figure 1:
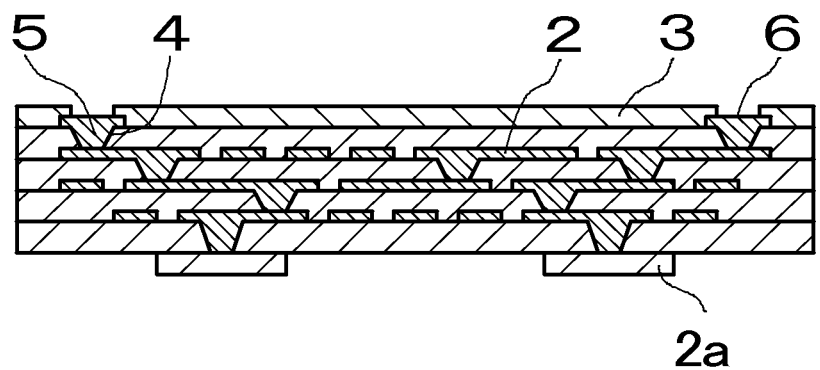
Figure 1:
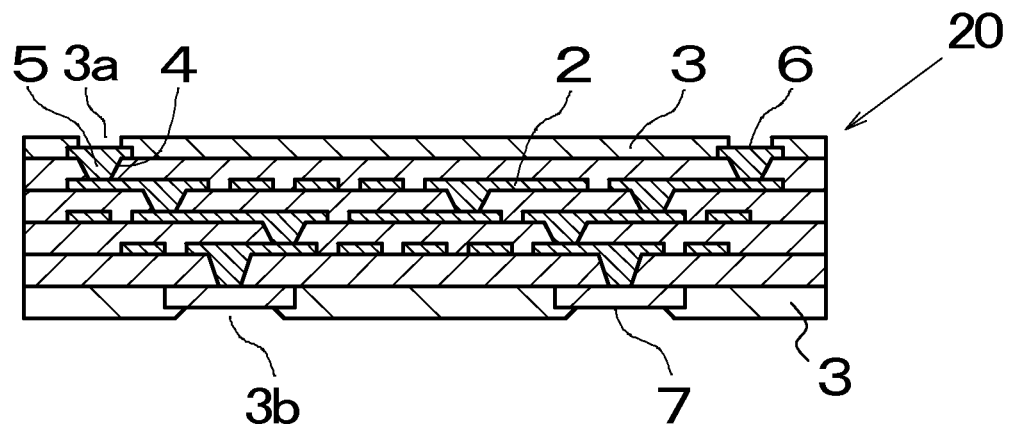

When a laminated body 14 for a wiring board 20, described later, is manufactured, the prepregs 8P are used for forming a supporting substrate 8 for supporting the laminated body 14 with necessary flatness being maintained. One main surface A of the prepreg 8P is a product forming surface, and the other main surface B is a separation surface. Each of the prepregs 8P has a product forming region X, and a marginal region Y on an outer periphery of the product forming region X. The product forming region X is a square region, and the wiring board 20 is formed on the product forming region X. For convenience, FIG. 1 illustrates only one product forming region X corresponding to one wiring board 20, but actually the supporting substrate 8 has several dozen to several thousands of the product forming regions X. The marginal region Y is a square frame-shaped region that surrounds the product forming region X. The marginal region Y is a region that is cut off and removed when a plurality of the wiring boards 20 formed on the product forming region X are cut into individual wiring boards 20. The prepreg 8P has a thickness of about 0.1 to 2.0 mm, and has an approximately square shape of about 400 to 1000 mm in a longitudinal and transverse size, respectively. A plate shaped product that is brought into a semi-cured state by impregnating glass fiber with thermosetting resin such as epoxy resin is used as the prepregs 8P.

The separation films 9 are inserted between the two prepregs 8P, and are used for easily separating the two supporting substrates 8 obtained by curing the prepregs 8P from each other. The separation film 9 has a thickness of about 1 to 35 µm, and a longitudinal and transverse size of about 400 to 1000 mm, respectively. The longitudinal and transverse size of the separation film 9 exceeds the size of the marginal region Y, and is preferably equal to the size of the prepreg 8P. It is preferable that a lot of openings 11 whose diameter is about 0.1 to 1 mm are formed on the portion of the separation film 9 protruding from the marginal region Y. It is preferable that the separation film 9 is composed of, for example, a metal foil such as a copper foil, or a heat resistant film such as a polyethylene telephthalate (PET) film.

The separable metal foils 10 are such that a first metal foil 10a and a second metal foil 10b are held separably from each other via an adhesive layer (not illustrated). It is preferable that the first metal foil 10a has a thickness of about 1 to 7 µm, and has an area larger than that of the product forming region X and smaller than that of the second metal foil 10b. It is preferable that the second metal foil 10b has a thickness of about 10 to 30 µm, and has a length and a breadth that are longer than those of the first metal foil 10a by about 10 to 20 mm. When the second metal foil 10b has the length and the breadth that are longer than those of the first metal foil 10a by about 10 to 20 mm, a wasted part of the supporting substrate becomes small, and the wiring board is manufactured effectively. That is, as described above, the supporting substrate 8 has several dozen to several thousands of the product forming regions X, and if the second metal foil 10b is too large, the number of the product forming regions X formed on the supporting substrate 8 becomes small. It is preferable that the first metal foil 10a and the second metal foil 10b are composed of good conductive metal such as copper. It is preferable that the adhesive layer is composed of a heat resistant adhesive material such as silicon resin or acrylic resin, or a nickel metal layer in order to resist a thermal load to be applied during the manufacture of the wiring board 20. It is preferable that such an adhesive layer has an adhesive force of about 1 to 10 N/m because when a build-up section 13, described later, is separated from the supporting substrate 8, the first metal foil 10a and the second metal foil 10b are prevented from partially remaining.

As illustrated in FIG. 1B, the two separation films 9 are laminated to be held between the two prepregs 8P, and the separable metal foils 10 are arranged on the centers of the product forming surfaces A of the prepregs 8P, respectively, with the first metal foil 10a facing the product forming surface A. At this time, since the separation films 9 and the separable metal foils 10 have such a size that they protrude from the marginal region Y, the protruded portions enable accurate locating on a predetermined position between the prepregs 8P. As a method for locating the separation films 9 and the separable metal foils 10, for example, a method using locating pins is employed. In this method, locating holes corresponding to the locating pins are provided on the prepregs 8P, the separation films 9 and the separable metal foils 10, and the locating pins are inserted into the locating holes so that the locating is carried out.

A laminated product in a state of FIG. 1B is heated while it is being pressurized in an up-down direction. Due to such a pressurizing and heating process, as illustrated in FIG. 1C, the two supporting substrates 8 obtained by curing the prepregs 8P hold the two separation films 9 and they are jointed to each other, and a wiring board forming base 12 where the separable metal foils 10 are buried into the product forming surfaces A of the supporting substrates 8 is formed. For example, when the second metal foil 10b has a large thickness of about 10 to 30 µm, the boundary between the first and second metal foils 10a and 10b can be buried into a deep position of the supporting substrate 8. In this embodiment, since the second metal foil 10b is larger than the first metal foil 10a, the second metal foil 10b is buried so as to cover the first metal foil 10a and the supporting substrate 8 around and the first metal foil 10a. Therefore, the boundary between the first and second metal foils 10a and 10b can be securely shielded from external environments. The separation films 9 are formed with a lot of openings 11 whose diameter is about 0.1 to 1 mm on the portions protrude from the marginal region Y. For this reason, the supporting substrates 8 are jointed to each other via the openings 11 so that the two supporting substrates 8 are fixed to each other. On the product forming region X, the separation films 9 do not adhere to each other but overlap with each other.

Next, as illustrated in FIG. 1D, in the surface of the second metal foil 10b exposed on both main surfaces of the wiring board forming base 12, a plurality of the insulating layers 1 and a plurality of the wiring conductor layers 2 are laminated alternately in this order. A solder resist layer 3 is deposited on the insulating layers 1 and the wiring conductor layers 2 as outermost layers so that the build-up section 13 for a wiring board is formed.

The insulating layer 1 is composed of, for example, thermosetting resin such as epoxy resin or bismaleimide triazine resin. The insulating layer 1 is formed by thermocompression-bonding a film formed from an uncured product of an epoxy resin or bismaleimide triazine resin composition where an inorganic insulative filler is dispersed onto the second metal foil 10b or onto the insulating layer 1 on a lower layer in a vacuum and coating state. A plurality of via holes 4 that are filled with a via conductor 5 for conduction between the layers are formed on the insulating layer 1 by, for example, laser processing.

The wiring conductor layer 2 is formed by depositing a conductor pattern composed of electroless plating or electroplating on the surface of the insulating layer 1 and the inner surfaces of the via holes 4 by, using, for example, the known semi-additive method. Good conductive materials such as electroless copper plating and copper electroplating are used for the electroless plating and the electroplating used in the semi-additive method.

The solder resist layer 3 is formed by applying a paste where an inorganic filler such as silica is dispersed into acrylic-modified epoxy resin to the insulating layer 1 and the wiring conductor layer 2 as the outermost layer using screen printing or the like, and exposing and developing the product into a predetermined pattern through a photolithography technique so as to thermally curing the product. A part of the wiring conductor layer 2 as the outermost layer exposed from the solder resist layer 3 functions as a semiconductor element connecting pad 6.

Next, as illustrated in FIG. 1E, the wiring board forming base 12 and the build-up section 13 are cut on the boundary between the product forming region X and the marginal region Y, so that the wiring board forming base 12 and the build-up section 13 on the product forming region X are cut out. For example, a dicing device may be used for the cutting.

Next, as illustrated in FIG. 1F, the wiring board forming base 12 on which the cut-out build-up section 13 is formed is separated from between the separation films 9. Since the separation films 9 are only fitted to each other by pressurizing and heating, they can be easily separated from each other.

Next, as illustrated in FIG. 1G, the build-up section 13 is separated from the first metal foil 10a. As a result, the laminated body 14 for the wiring board 20 to which the second metal foil 10b is fixed is formed on the lower surface of the build-up section 13. The second metal foil 10b is just held on the first metal foil 10a separably via the adhesive layer. Therefore, the laminated body 14 can be easily separated without damage by peeling the first metal foil 10a and the second metal foil 10b from each other.

Next, as illustrated in FIG. 1H, an etching resist R having a pattern corresponding to the wiring conductor layer 2a is formed on an exposed surface of the second metal foil 10b. Next, as illustrated in FIG. 1I, the second metal foil 10b exposed from the etching resist R is removed by etching, and then the etching resist R is removed by peeling so that the wiring conductor layer 2a is formed.

Finally, as illustrated in FIG. 1J, the solder resist layer 3 having an opening 3b is formed on the insulating layer 1 and the wiring conductor layer 2a as the lowermost layer. The forming method is as described above and is, thus, omitted. In such a manner, the wiring board 20 illustrated in FIG. 2 is formed.

Figure 2:
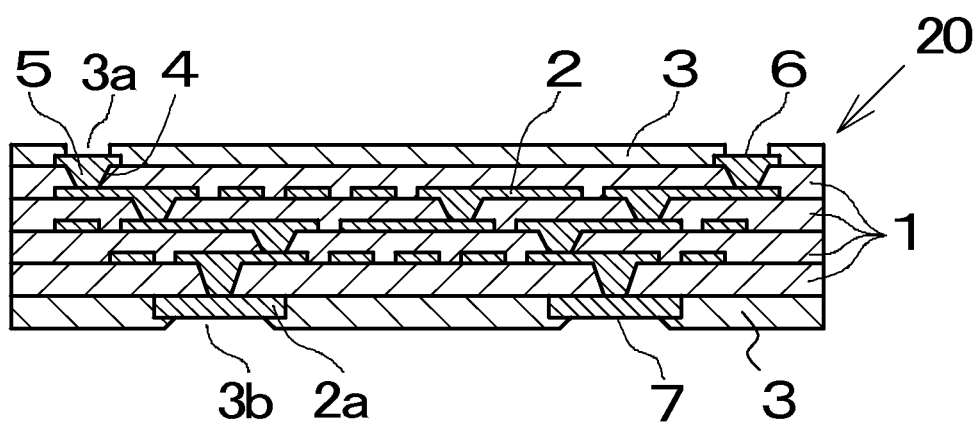
FIG. 2 is a schematic cross-sectional view illustrating a wiring board manufactured by the method illustrated in FIGS. 1A to 1J.

As illustrated in FIG. 2, in the wiring board 20 manufactured by the method of the present invention, for example, the four insulating layers 1 are laminated, and the wiring conductor layer 2 is formed between the respective insulating layers 1 and on the surface of the insulating layer 1 as the outermost layer. The wiring conductor layer 2a is formed on the surface of the insulating layer 1 as the lowermost layer. Further, the solder resist layer 3 is formed on both the surfaces of the wiring board 20.

A plurality of via holes 4 are formed on the respective insulating layers 1. A via conductor 5 that is formed integrally with the wiring conductor layer 2 is deposited inside the via holes 4. The via conductor 5 ensures conduction between the wiring conductor layers 2, and wiring conductor layers 2 and 2a formed on the respective insulating layers 1. A part of the wiring conductor layer 2 as the outermost layer forms the semiconductor element connecting pad 6. An electrode of a semiconductor element such as a microchip is connected to the semiconductor element connecting pad 6. A part of the wiring conductor layer 2a formed on the lowermost layer forms a circuit board connecting pad 7. An electrode of the circuit board mounted with the wiring board 20 is connected to the circuit board connecting pad 7. The semiconductor element connecting pad 6 and the circuit board connecting pad 7 are exposed from openings 3a and 3b provided on the solder resist layer 3.

According to the method for manufacturing the wiring board of the present invention, the thickness of the first metal foil 10a is thin, and the thickness of the second metal foil 10b is thick. For this reason, the boundary between the first and second metal foils 10a and 10b can be easily buried into the deep position of the supporting substrate 8. Further, in this embodiment, since the second metal foil 10b is larger than the first metal foil 10a, the first metal foil 10a that is coated with the second metal foil 10b is buried. Therefore, the boundary between the first and second metal foils 10a and 10b can be securely shielded from external environments. As a result, a medical solution for forming the wiring conductor layer 2 can be prevented from infiltrating the first metal foil 10a and the second metal foil 10b through the boundary therebetween. Therefore, the method for manufacturing the wiring board 20 with high producibility in which the adhesion between the build-up section 13 and the supporting substrate 8 is not poor and the build-up section 13 is not peeled can be provided.

The present invention is not limited to the above-described one embodiment, and can be modified variously without departing from the spirit of the present invention. For example, in the above-described embodiment, the circuit board connecting pad 7 is formed so as to protrude from the surface of the insulating layer 1, but the circuit board connecting pad 7 may be formed so as not to protrude from the surface of the insulating layer.

Figure 3:
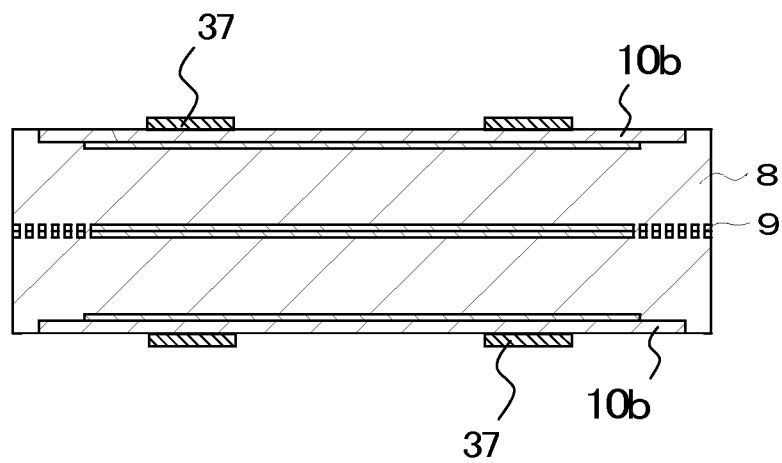
FIGS. 3A to 3C are schematic cross-sectional views illustrating a method for manufacturing a wiring board according to another embodiment of the present invention.
Figure 3:
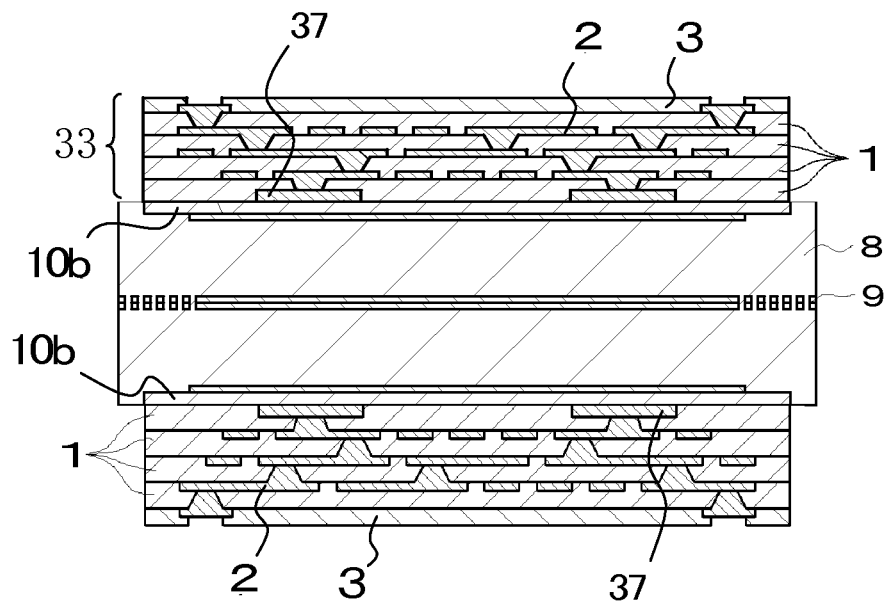
Figure 3:
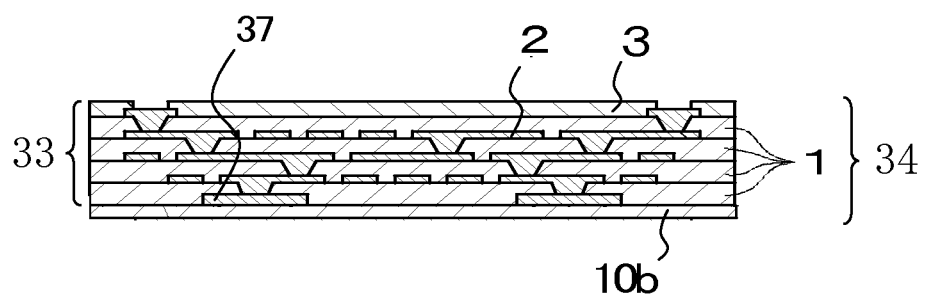

After steps similar to those in FIGS. 1A to 1C are executed, as illustrated in FIG. 3A, a circuit board connecting pad 37 (the wiring conductor layer 2) made of copper or the like is formed on the second metal foil 10b by the semi-additive method. Thereafter, as illustrated in FIG. 3B, a plurality of the insulating layers 1 and a plurality of the wiring conductor layers 2 are laminated thereon alternately similarly to the case where the wiring board 10 is manufactured. That is to say, in this embodiment, a plurality of the wiring conductor layers 2 and a plurality of the insulating layers 1 are laminated alternately in this order on the surface of the second metal foil 10b exposed on both the main surfaces of the wiring board forming base 12. The solder resist layer 3 is deposited on the insulating layer 1 and the wiring conductor layer 2 as the outermost layer so that a build-up section 33 for a wiring board is formed.

Figure 4:
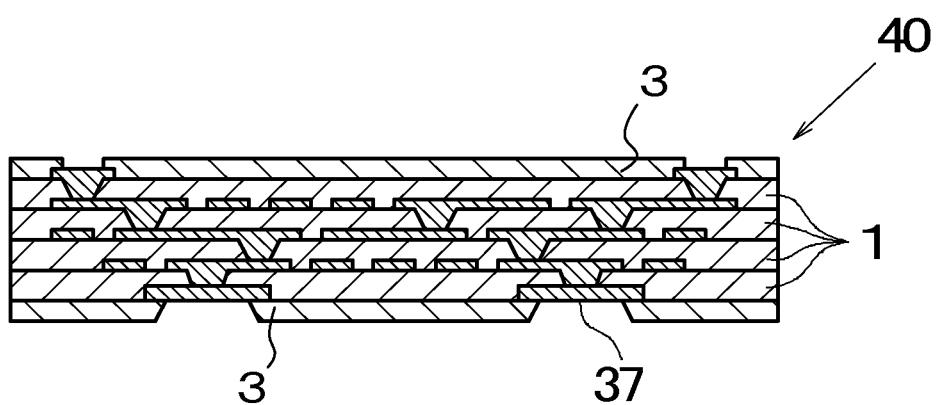
FIG. 4 is a schematic cross-sectional view illustrating a wiring board manufactured by the method illustrated in FIGS. 3A to 3C.

Steps similar to those in FIGS. 1E to 1G are executed, so that the build-up section 33 of the product forming region X is separated from the first metal foil 10a, and as illustrated in FIG. 3C, a laminated body 34 for a wiring board to which the second metal foil 10b is fixed is formed on the lower surface of the build-up section 33. After the second metal foil 10b that is fixed to the laminated body 34 is entirely removed through etching, step similar to that in FIG. 1J is executed so that a wiring board 40 illustrated in FIG. 4 is obtained. In the wiring board 40 illustrated in FIG. 4, the circuit board connecting pad 37 does not protrude from the surface of the insulating layer 1.

What is claimed is:

1. A method for manufacturing a wiring board comprising the steps of:
   preparing a supporting substrate having a product forming region and a frame-shaped marginal region surrounding the product forming region;
   preparing a separable metal foil which is composed of a first metal foil and a second metal foil that are separably adhered to each other and whose area is larger than that of the product forming region and is smaller than that of the supporting substrate, the first metal foil and the second metal foil have a square shape, and a length and a breadth of the second metal foil are longer than those of the first metal foil by 10 to 20 mm;
   fixing a lower surface and a side surface of the separable metal foil to the supporting substrate by pressing the separable metal foil against an upper surface of the product forming region with the first metal foil facing the supporting substrate, and burying the lower surface and the side surface of the separable metal foil into the supporting substrate;
   forming a build-up section composed of a plurality of insulating layers and a plurality of wiring conductor layers by forming a wiring conductor layer on the buried separable metal foil, and laminating and fixing the insulating layers and the wiring conductor layers alternately in this order thereon;
   integrally cutting out the supporting substrate, the separable metal foil and the build-up section that form the product forming region by cutting the supporting substrate, the separable metal foil and the build-up section on a boundary between the product forming region and the marginal region;
   obtaining a laminated body for wiring board composed of the second metal foil and the build-up section by separating the cut-out supporting substrate and the build-up section between the first metal foil and the second metal foil; and
   removing the second metal foil fixed to the build-up section entirely through etching.

2. The method for manufacturing a wiring board according to claim 1, wherein an area of the first metal foil is larger than an area of the product forming region and is smaller than an area of the second metal foil, and an outer periphery of the second metal foil is buried into and fixed to an upper surface of the supporting substrate so as to protrude from an outer periphery of the first metal foil.

3. The method for manufacturing a wiring board according to claim 1, wherein the second metal foil is thicker than the first metal foil.

4. The method for manufacturing a wiring board according to claim 3, wherein the first metal foil has a thickness of 1 to 7 μm, and the second metal foil has a thickness of 10 to 30 μm.

* * * * *